(12) United States Patent
Uetake

(10) Patent No.: US 6,903,550 B2
(45) Date of Patent: Jun. 7, 2005

(54) EDDY CURRENT CORRECTION METHOD AND MAGNETIC RESONANCE IMAGING APPARATUS

(75) Inventor: Nozomu Uetake, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/772,880

(22) Filed: Feb. 5, 2004

(65) Prior Publication Data

US 2004/0155655 A1 Aug. 12, 2004

(30) Foreign Application Priority Data

Feb. 6, 2003 (JP) ........................................ 2003-029096

(51) Int. Cl.[7] ................................................ G01V 3/00
(52) U.S. Cl. ...................................... 324/307; 324/322
(58) Field of Search .............................. 324/307, 309, 324/314, 318, 322, 300, 306

(56) References Cited

U.S. PATENT DOCUMENTS

| | | | |
|---|---|---|---|
| 4,761,612 A | 8/1988 | Holland et al. | |
| 4,928,063 A | 5/1990 | Lampman et al. | |
| 4,965,521 A | 10/1990 | Egloff | |
| 4,978,919 A | 12/1990 | Hinks | |
| 5,332,969 A | 7/1994 | Tsuruno et al. | |
| 5,442,290 A * | 8/1995 | Crooks | 324/309 |
| 5,451,877 A | 9/1995 | Weissenberger | |
| 5,864,233 A * | 1/1999 | Zhou et al. | 324/309 |
| 6,025,715 A * | 2/2000 | King et al. | 324/309 |
| 6,154,030 A * | 11/2000 | Wurl | 324/322 |
| 6,191,582 B1 * | 2/2001 | Zur | 324/307 |
| 6,271,666 B1 | 8/2001 | Linz et al. | |
| 6,448,773 B1 | 9/2002 | Zhang | |

* cited by examiner

*Primary Examiner*—Louis Arana
(74) *Attorney, Agent, or Firm*—Carl B. Horton, Esq.; Armstrong Teasdale LLP

(57) ABSTRACT

For the purpose of conducting optimal eddy current correction within a limited output range, a corrective value for eddy current correction for a gradient magnetic field is calculated, if the calculated value does not exceed a predetermined upper limit value, correction is conducted on the gradient magnetic field using the calculated value, and if the calculated value exceeds the predetermined upper limit value, a plurality of gradient magnetic fields affected by eddy current are simulated using a plurality of candidate corrective values not greater than the upper limit value, and correction is conducted on the gradient magnetic field using a candidate corrective value by which a relatively optimal gradient magnetic field can be obtained.

16 Claims, 7 Drawing Sheets

EDDY CURRENT CORRECTION METHOD AND MAGNETIC RESONANCE IMAGING APPARATUS

REFERENCE TO RELATED APPLICATIONS

This application claims the benefit of Japanese Application No. 2003-029096 filed Feb. 6, 2003.

BACKGROUND OF THE INVENTION

The present invention relates to an eddy current correction method and magnetic resonance imaging apparatus, and more particularly to a method of correcting an effect by eddy current on a gradient magnetic field, and a magnetic resonance imaging apparatus comprising eddy current correcting means.

In a magnetic resonance imaging apparatus, a corrective signal is appended to a gradient magnetic field signal to correct an effect by eddy current on a gradient magnetic field generated by a gradient magnetic field generating apparatus (for example, see Patent Document 1). The appending of the corrective signal for correcting eddy current of short time constant is sometimes referred to as pre-emphasis. This term is derived from a technique of, allowing for weakening of the waveform of an effective gradient magnetic field due to an effect by eddy current, emphasizing the waveform beforehand.

[Patent Document 1]

Japanese Patent Application Laid Open No. 4-22338 (Pages 3–4, FIGS. 2–3)

However, the pre-emphasis sometimes cannot be done as required because of the output limit of a gradient power supply or the like, so that it becomes impossible to perform the eddy current correction properly.

SUMMARY OF THE INVENTION

It is therefore an object of the present invention to provide a method of conducting optimal eddy current correction within a limited output range, and a magnetic resonance imaging apparatus comprising such eddy current correcting means.

(1) The present invention, in one aspect for solving the aforementioned problem, is an eddy current correction method characterized in comprising: calculating a corrective value for eddy current correction for a gradient magnetic field; if the calculated value does not exceed a predetermined upper limit value, conducting correction on the gradient magnetic field using the calculated value; and if the calculated value exceeds the predetermined upper limit value, simulating a plurality of gradient magnetic fields affected by eddy current using a plurality of candidate corrective values not greater than the upper limit value, and conducting correction on the gradient magnetic field using the candidate corrective value by which a relatively optimal gradient magnetic field can be obtained.

(2) The present invention, in another aspect for solving the aforementioned problem, is a magnetic resonance imaging apparatus for applying to a subject to be imaged a static magnetic field, a gradient magnetic field and an RF magnetic field generated by static magnetic field generating means, gradient magnetic field generating means and RF magnetic field generating means, respectively, acquiring magnetic resonance signals, and producing an image by image producing means based on the acquired magnetic resonance signals, said apparatus characterized in comprising: calculating means for calculating a corrective value for eddy current correction for said gradient magnetic field; and correcting means for, if the calculated value does not exceed a predetermined upper limit value, conducting correction on said gradient magnetic field using the calculated value, and if the calculated value exceeds the predetermined upper limit value, simulating a plurality of gradient magnetic fields affected by eddy current using a plurality of candidate corrective values not greater than the upper limit value, and conducting correction on said gradient magnetic field using the candidate corrective value by which a relatively optimal gradient magnetic field can be obtained.

In the invention of these aspects, a corrective value for eddy current correction for a gradient magnetic field is calculated; if the calculated value does not exceed a predetermined upper limit value, correction on the gradient magnetic field is conducted using the calculated value; and if the calculated value exceeds the predetermined upper limit value, a plurality of gradient magnetic fields affected by eddy current are simulated using a plurality of candidate corrective values not greater than the upper limit value, and correction on the gradient magnetic field is conducted using the candidate corrective value by which a relatively optimal gradient magnetic field can be obtained, and therefore, optimal eddy current correction can be achieved within a limited output range.

Preferably, said upper limit value is the maximum corrective value that can be output by a gradient power supply, so that performance of the gradient power supply can be maximized in the eddy current correction. Preferably, said optimal gradient magnetic field is the gradient magnetic field whose length in a flat top portion of a trapezoidal wave is longest, so that the optimal trapezoidal gradient magnetic field can be obtained. Preferably, said optimal gradient magnetic field is the gradient magnetic field whose waveform area is least different from the waveform area of an ideal gradient magnetic field, so that the gradient magnetic field closest to an ideal gradient magnetic field can be obtained.

Preferably, said plurality of candidate corrective values are determined by sequentially decreasing said calculated value, so that suitable candidate values may be obtained. Preferably, the step difference in said decreasing is constant, so that the candidate values may be easily obtained. Preferably, said candidate corrective values are not lower than a predetermined lower limit value, so that excessive decreasing of the candidate value may be prevented. Preferably, if the optimal gradient magnetic field cannot be obtained, the correction is conducted using said lower limit value, so that eddy current correction may be conducted with minimum correction.

Moreover, if the calculated value exceeds the predetermined upper limit value, an empirically predetermined corrective value may be used instead of the corrective value determined by the simulation.

Therefore, the present invention provides a method of conducting optimal eddy current correction within a limited output range, and a magnetic resonance imaging apparatus comprising such eddy current correcting means Further objects and advantages of the present invention will be apparent from the following description of the preferred embodiments of the invention as illustrated in the accompanying drawings.

DETAILED DESCRIPTION OF THE INVENTION

Figure 1:
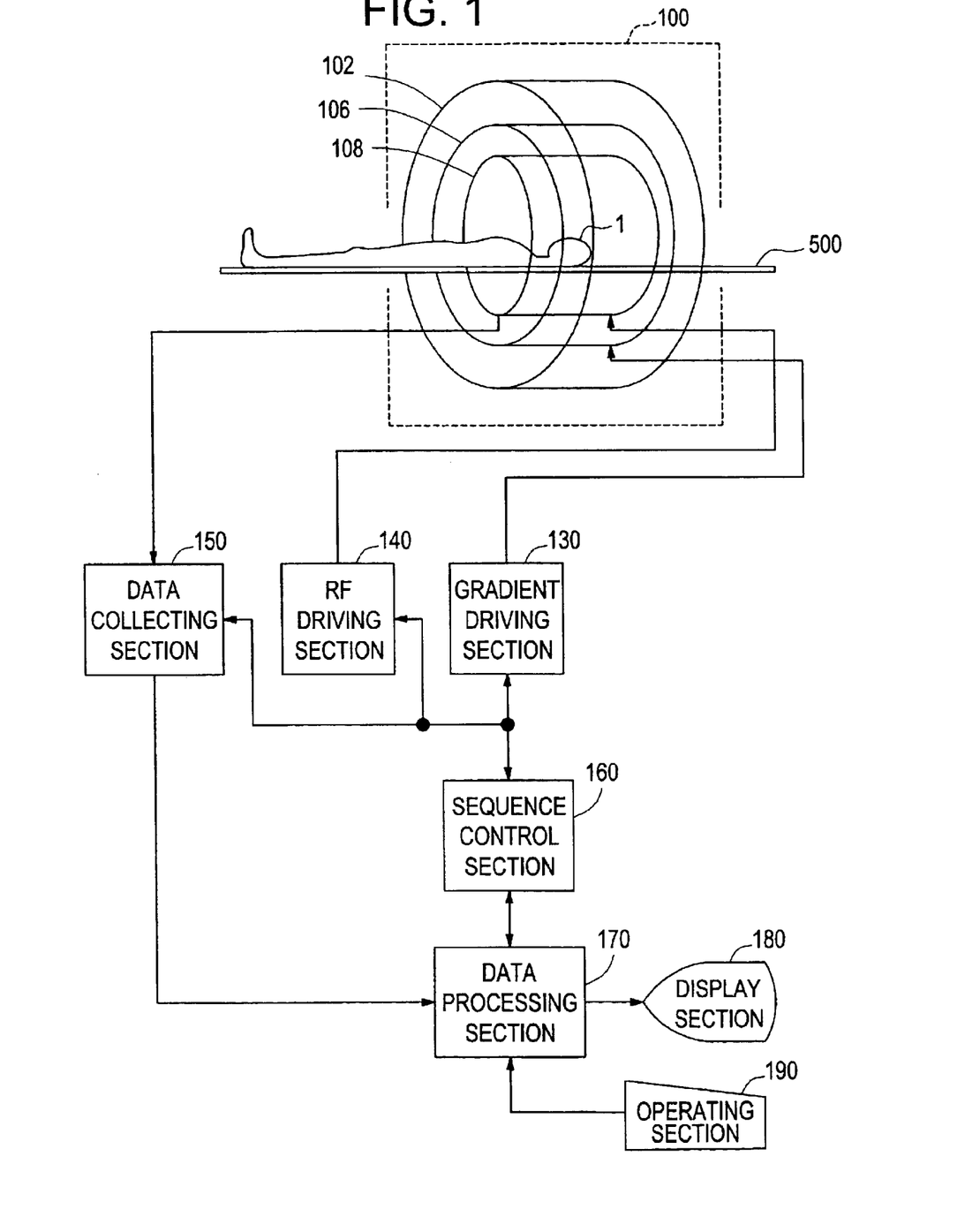
FIG. 1 is a block diagram of an apparatus in accordance with one embodiment of the present invention.

Embodiments of the present invention will now be described in detail with reference to the accompanying drawings. FIG. 1 shows a block diagram of a magnetic resonance imaging apparatus. The configuration of the apparatus represents an embodiment of the apparatus in accordance with the present invention. The operation of the apparatus represents an embodiment of the method in accordance with the present invention.

As shown in FIG. 1, the present apparatus has a magnet system 100. The magnet system 100 has a main magnetic field coil section 102, a gradient coil section 106, and an RF coil section 108. These coil sections have a generally cylindrical shape and are concentrically disposed. A subject to be imaged 1 is rested on a cradle 500 and carried into and out of a generally cylindrical internal space (bore) of the magnet system 100 by carrier means, which is not shown.

The main magnetic field coil section 102 generates a static magnetic field in the internal space of the magnet system 100. The direction of the static magnetic field is generally in parallel with the direction of the body axis of the subject 1. That is, a magnetic field commonly referred to as a horizontal magnetic field is generated. The main magnetic field coil section 102 is made using a superconductive coil, for example. However, the main magnetic field coil section 102 is not limited to the superconductive coil, and may be made using a normal conductive coil or the like.

The gradient coil section 106 generates three gradient magnetic fields for imparting gradients to the static magnetic field strength in directions of three mutually perpendicular axes, i.e., a slice axis, a phase axis, and a frequency axis. The gradient magnetic field generated by the gradient coil section 106 is subjected to eddy current correction. The eddy current correction will be described in detail later.

When mutually perpendicular coordinate axes in the static magnetic field space are represented as x, y, and z, any one of the axes may be the slice axis. In this case, one of the two remaining axes is the phase axis and the other is the frequency axis. Moreover, the slice, phase, and frequency axes can be given arbitrary inclination with respect to the x-, y-, and z-axes while maintaining their mutual perpendicularity. This is sometimes referred to as an oblique technique. In the present apparatus, the direction of the body axis of the subject 1 is defined as the z-axis direction.

The gradient magnetic field in the slice axis direction is sometimes referred to as the slice gradient magnetic field. The gradient magnetic field in the phase axis direction is sometimes referred to as the phase encoding gradient magnetic field. The gradient magnetic field in the frequency axis direction is sometimes referred to as the readout gradient magnetic field. The readout gradient magnetic field is synonymous with the frequency encoding gradient magnetic field. In order to enable generation of such gradient magnetic fields, the gradient coil section 106 has three gradient coils, which are not shown. The gradient magnetic field will be sometimes referred to simply as the gradient hereinbelow.

The RF coil section 108 generates a radio frequency magnetic field in the static magnetic field space for exciting spins within the subject 1. The generation of the radio frequency magnetic field will be sometimes referred to as transmission of an RF excitation signal hereinbelow. Moreover, the RF excitation signal will be sometimes referred to as the RF pulse. Electromagnetic waves, i.e., magnetic resonance signals, generated by the excited spins are received by the RF coil section 108.

The magnetic resonance signals are those in a frequency domain, i.e., in a Fourier space. Since the magnetic resonance signals are encoded in two axes by the gradients in the phase- and frequency-axis directions, the magnetic resonance signals are obtained as signals in a two-dimensional Fourier space. The phase encoding gradient and readout gradient are used to determine a position at which a signal is sampled in the two-dimensional Fourier space. The two-dimensional Fourier space will be sometimes referred to as the k-space hereinbelow.

The gradient coil section 106 is connected with a gradient driving section 130. The gradient driving section 130 supplies driving signals to the gradient coil section 106 to generate the gradient magnetic fields. The gradient driving section 130 has three driving circuits, which are not shown, corresponding to the three gradient coils in the gradient coil section 106.

The RF coil section 108 is connected with an RF driving section 140. The RF driving section 140 supplies driving signals to the RF coil section 108 to transmit the RF pulse, thereby exciting the spins within the subject 1.

The main magnetic field coil section 102 is an embodiment of the static magnetic field generating means in the present invention. A portion comprised of the gradient coil section 106 and gradient driving section 130 is an embodiment of the gradient magnetic field generating means in the present invention. A portion comprised of the RF coil section 108 and RF driving section 140 is an embodiment of the RF magnetic field generating means in the present invention.

The RF coil section 108 is connected with a data collecting section 150. The data collecting section 150 collects signals received by the RF coil section 108 as digital data.

The gradient driving section 130, RF driving section 140 and data collecting section 150 are connected with a sequence control section 160. The sequence control section 160 controls the gradient driving section 130, RF driving section 140 and data collecting section 150 to carry out the collection of magnetic resonance signals.

The sequence control section 160 is, for example, constituted using a computer. The sequence control section 160 has a memory, which is not shown. The memory stores programs for the sequence control section 160 and several kinds of data. The function of the sequence control section 160 is implemented by the computer executing a program stored in the memory.

The output of the data collecting section 150 is connected to a data processing section 170. Data collected by the data collecting section 150 are input to the data processing section 170. The data processing section 170 is, for example, constituted using a computer. The data processing section 170 has a memory, which is not shown. The memory stores programs for the data processing section 170 and several kinds of data.

The data processing section 170 is connected to the sequence control section 160. The data processing section 170 is above the sequence control section 160 and controls it. The function of the present apparatus is implemented by the data processing section 170 executing a program stored in the memory.

The data processing section 170 stores the data collected by the data collecting section 150 into the memory. A data space is established in the memory. The data space corresponds to the k-space. The data processing section 170 performs two-dimensional inverse Fourier transformation on the data in the k-space to reconstruct an image. The data processing section 170 is an embodiment of the image producing means in the present invention.

The data processing section 170 is connected with a display section 180 and an operating section 190. The display section 180 comprises a graphic display, etc. The operating section 190 comprises a keyboard, etc., provided with a pointing device.

The display section 180 displays the reconstructed image output from the data processing section 170 and several kinds of information. The operating section 190 is operated by a user, and the section 190 inputs several commands, information and so forth to the data processing section 170. The user interactively operates the present apparatus via the display section 180 and operating section 190.

Figure 2:
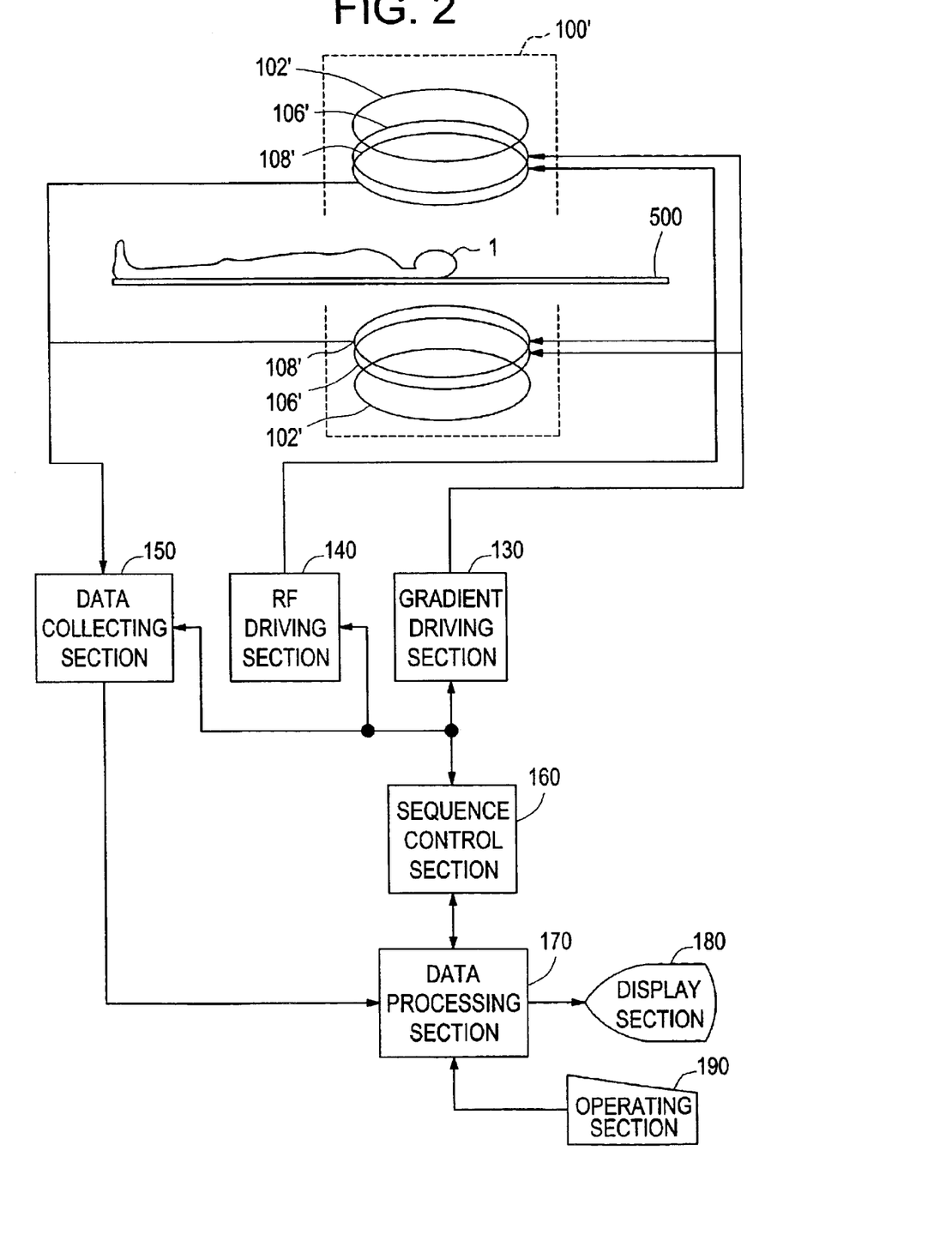
FIG. 2 is a block diagram of an apparatus in accordance with one embodiment of the present invention.

FIG. 2 shows a block diagram of a magnetic resonance imaging apparatus of another type, which is one embodiment of the present invention. The configuration of the apparatus represents an embodiment of the apparatus in accordance with the present invention. The operation of the apparatus represents an embodiment of the method in accordance with the present invention.

The present apparatus has a magnet system 100' of a type different from that of the apparatus shown in FIG. 1. Since the apparatus has a configuration similar to that of the apparatus shown in FIG. 1 except for the magnet system 100', similar portions are designated by similar reference numerals and the explanation thereof will be omitted.

The magnet system 100' has a main magnetic field magnet section 102', a gradient coil section 106', and an RF coil section 108'. The main magnetic field magnet section 102' and the coil sections each consists of a pair of members facing each other across a space. These sections have a generally disk-like shape and are disposed to have a common center axis. A subject 1 is rested on a cradle 500 and carried into and out of an internal space (bore) of the magnet system 100' by carrier means, which is not shown.

The main magnetic field magnet section 102' generates a static magnetic field in the internal space of the magnet system 100'. The direction of the static magnetic field is generally orthogonal to the direction of the body axis of the subject 1. That is, a magnetic field commonly referred to as a vertical magnetic field is generated. The main magnetic field magnet section 102' is made using a permanent magnet, for example. However, the main magnetic field magnet section 102' is not limited to a permanent magnet, and may be made using a super or normal conductive electromagnet or the like.

The gradient coil section 106' generates three gradient magnetic fields for imparting gradients to the static magnetic field strength in directions of three mutually perpendicular axes, i.e., a slice axis, a phase axis and a frequency axis. The gradient magnetic field generated by the gradient coil section 106' is subjected to eddy current correction. The eddy current correction will be described in detail later.

When mutually perpendicular coordinate axes in the static magnetic field space are represented as x, y, and z, any one of the axes may be the slice axis. In this case, one of the two remaining axes is the phase axis and the other is the frequency axis. Moreover, the slice, phase, and frequency axes can be given arbitrary inclination with respect to the x-, y-, and z-axes while maintaining their mutual perpendicularity; that is, the oblique technique may be applied. In the present apparatus, the direction of the body axis of the subject 1 is again defined as the z-axis direction. In order to enable generation of the gradient magnetic fields in the three axis directions, the gradient coil section 106' has three gradient coils, which are not shown.

The RF coil section 108' transmits an RF pulse to the static magnetic field space for exciting spins within the subject 1. Electromagnetic waves, i.e., magnetic resonance signals, generated by the excited spins are received by the RF coil section 108'. The signals received by the RF coil section 108' are input to the data collecting section 150.

The main magnetic field coil section 102' is an embodiment of the static magnetic field generating means in the present invention. A portion comprised of the gradient coil section 106' and gradient driving section 130 is an embodiment of the gradient magnetic field generating means in the present invention. A portion comprised of the RF coil section 108' and RF driving section 140 is an embodiment of the RF magnetic field generating means in the present invention.

Figure 3A:
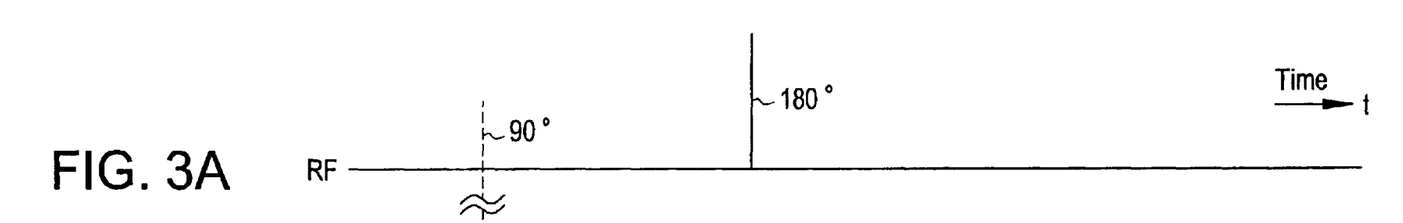
FIG. 3 shows an exemplary pulse sequence executed by the apparatus in accordance with one embodiment of the present invention.
Figures 3B, 3C:
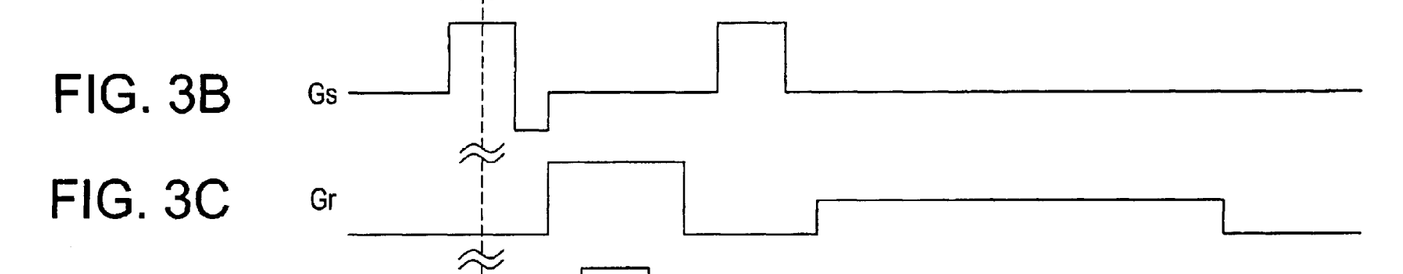
Figures 3D, 3E:
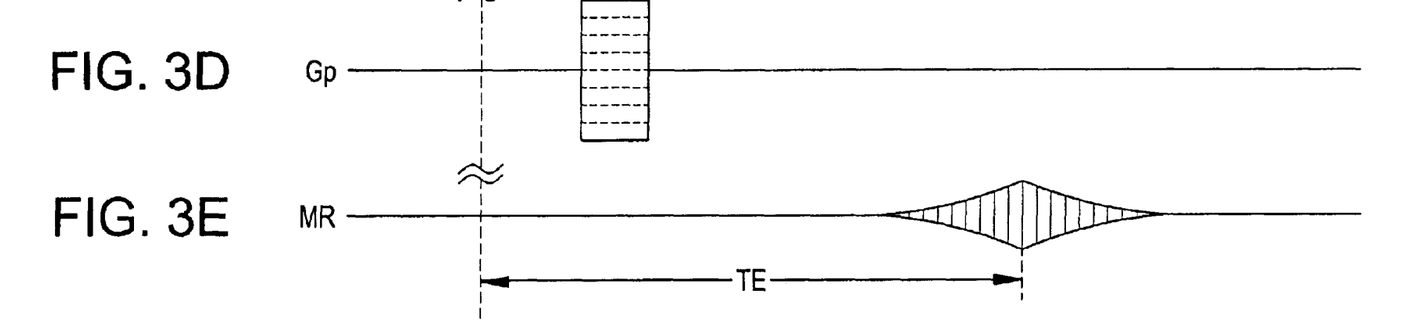
Figure 4A:
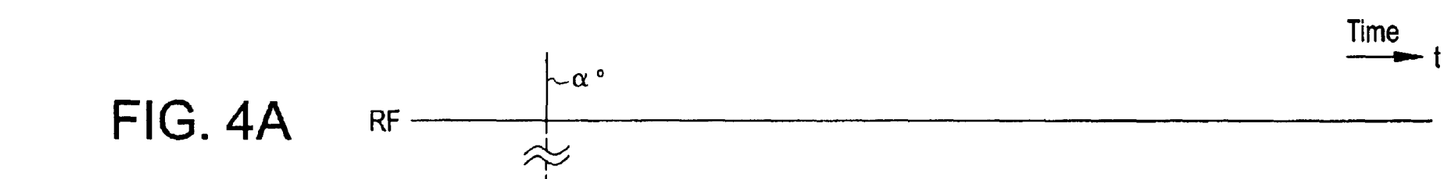
FIG. 4 shows an exemplary pulse sequence executed by the apparatus in accordance with one embodiment of the present invention.
Figure 4B:
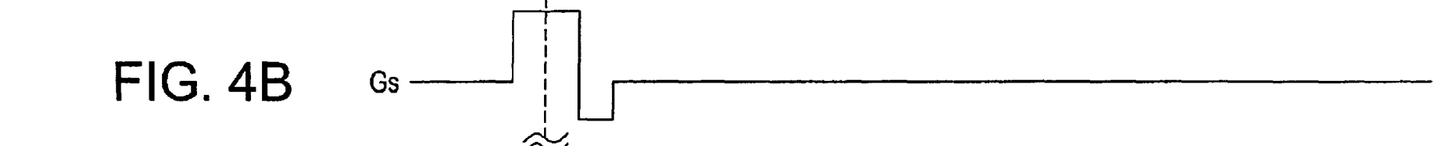
Figures 4C, 4D:
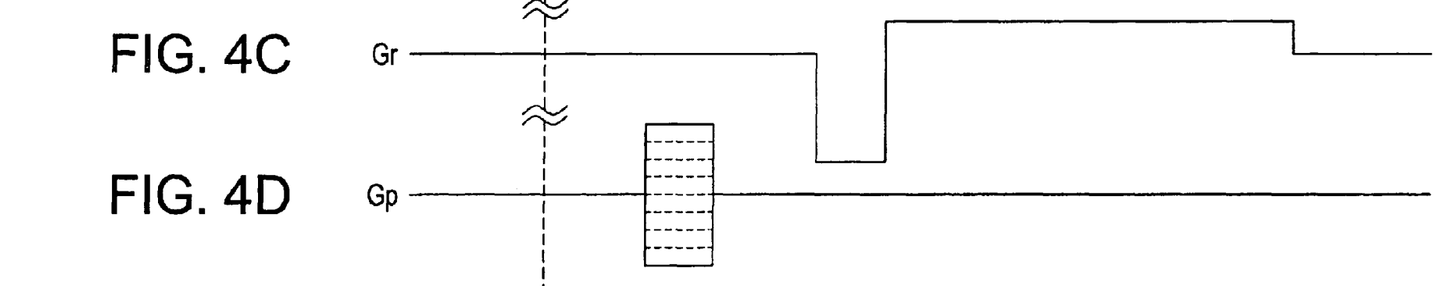
Figure 4E:
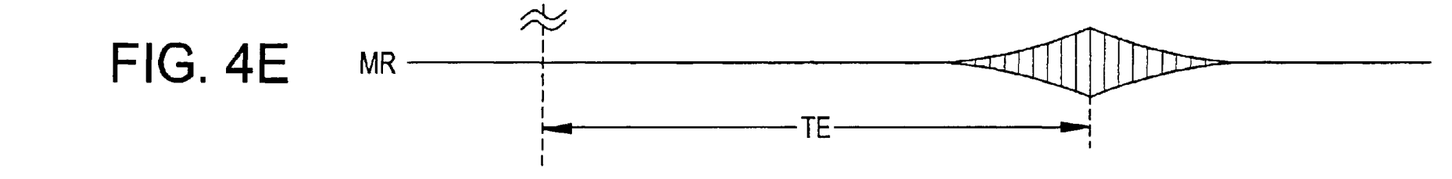

FIG. 3 shows an exemplary pulse sequence for use in magnetic resonance imaging. The pulse sequence is one according to a spin echo (SE) technique.

Specifically, FIG. 3(1) is a sequence of 90° and 180° pulses for RF excitation according to the SE technique, and (2), (3), (4), and (5) are sequences of a slice gradient Gs, readout gradient Gr, phase encoding gradient Gp, and spin echo MR, respectively, according to the SE technique. The 90° and 180° pulses are represented by their respective center signals. The pulse sequence proceeds along a time axis t from the left to the right.

As shown, the 90° pulse achieves 90° excitation of the spins. At that time, a slice gradient Gs is applied to perform selective excitation of a certain slice. After a certain time from the 90° excitation, 180° excitation, i.e., spin inversion, is achieved by the 180° pulse. Again, at that time, a slice gradient Gs is applied to perform selective inversion of the same slice.

In the period between the 90° excitation and spin inversion, a readout gradient Gr and a phase encoding gradient Gp are applied. The readout gradient Gr dephases the spins. The phase encoding gradient Gp phase-encodes the spins.

After the spin inversion, the spins are rephased by the readout gradient Gr to cause a spin echo MR to be generated. The spin echo MR is collected by the data collecting section 150 as view data. Such a pulse sequence is repeated 64–512 times in a cycle TR (repetition time). The phase encoding gradient Gp is changed for each repetition to effect different phase encodings each time. Thus, view data are obtained for 64–512 views.

Another example of the pulse sequence for magnetic resonance imaging is shown in FIG. 4. This pulse sequence is one according to a GRE (gradient echo) technique.

Specifically, FIG. 4(1) is a sequence of an α° pulse for RF excitation according to the GRE technique, and (2), (3), (4), and (5) are sequences of a slice gradient Gs, readout gradient Gr, phase encoding gradient Gp, and gradient echo MR, respectively, according to the GRE technique. The α° pulse is represented by its central value. The pulse sequence proceeds along a time axis t from the left to the right.

As shown, the α° pulse achieves α° excitation of the spins. α is 90 or less. At that time, a slice gradient Gs is applied to perform selective excitation of a certain slice.

After the α° excitation, phase encoding of the spins is achieved by the phase encoding gradient Gp. Next, the spins are first dephased and subsequently rephased by the readout gradient Gr to cause a gradient echo MR to be generated. The gradient echo MR is collected by the data collecting section 150 as view data. Such a pulse sequence is repeated 64–512 times in a cycle TR. The phase encoding gradient Gp is changed for each repetition to effect different phase encodings each time. Thus, view data are obtained for 64–512 views.

The view data acquired by the pulse sequence shown in FIG. 3 or 4 are collected in the memory in the data processing section 170. The pulse sequence is not limited to one according to the SE or GRE technique, and it will be easily recognized that a pulse sequence according to any other appropriate technique such as a fast spin echo (FSE) technique or echo planar imaging (EPI) may be employed. The data processing section 170 reconstructs an image based on the view data collected in the memory.

Figure 5:
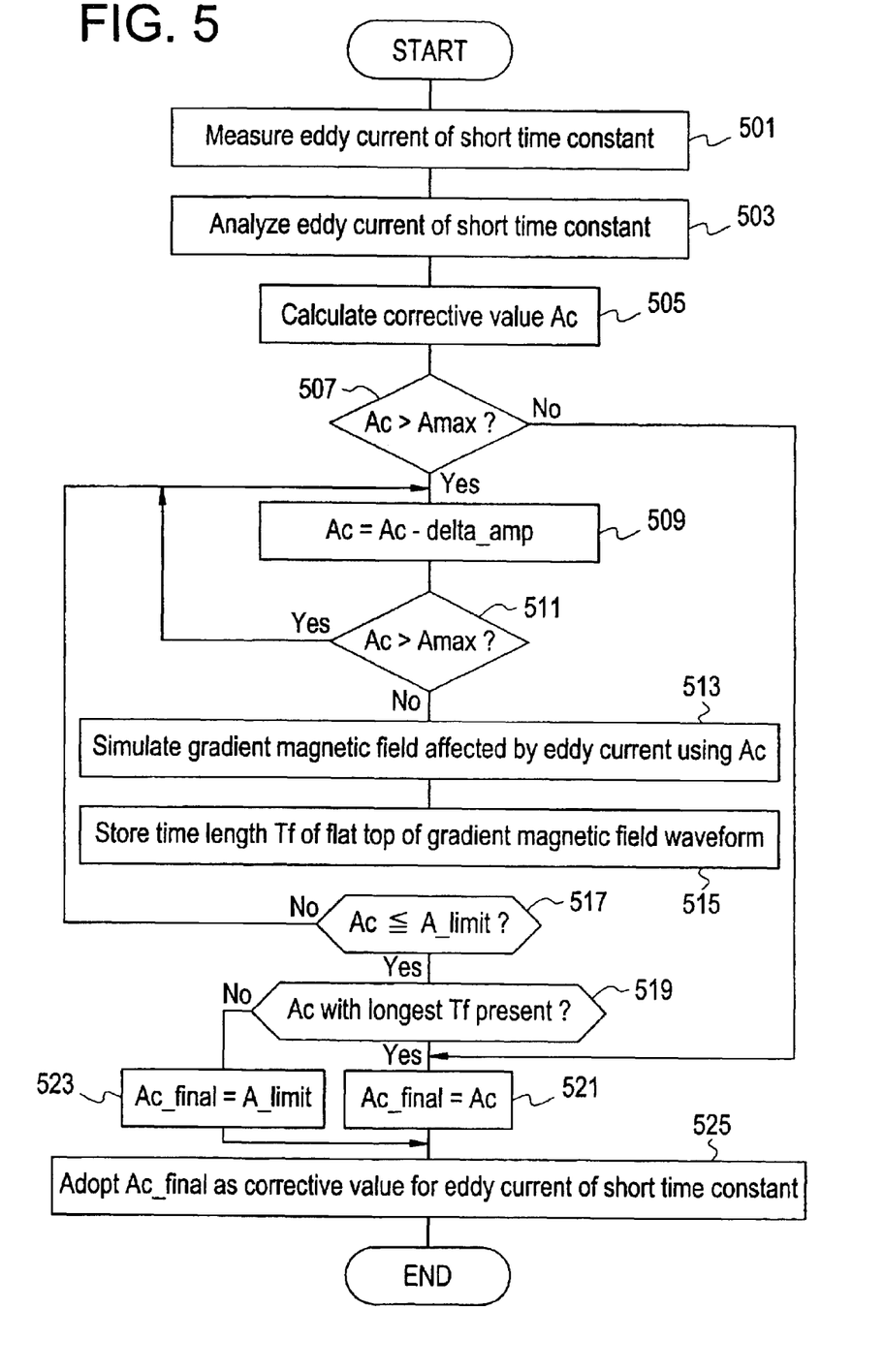
FIG. 5 is a flow chart of the operation by the apparatus in accordance with one embodiment of the present invention.

FIG. 5 shows a flow chart of the operation of the present apparatus in determining a corrective value for eddy current correction. The determination of the corrective value is conducted before a scan. As shown in FIG. 5, at Step 501, eddy current of short time constant is measured. At this step, eddy current of short time constant involved in gradient magnetic field generation in the magnet system 100 (100') is measured. Next, at Step 503, the eddy current of short time constant is analyzed. By this, the measured eddy current of short time constant is analyzed. Next, at Step 505, a corrective value Ac is calculated. Specifically, based on the result of the analysis of the eddy current of short time constant, a corrective value Ac for short-time-constant eddy current correction, i.e., a pre-emphasis value is calculated. The measurement and analysis of eddy current and calculation of a corrective value as described are well known in the art. The eddy current of short time constant will sometimes be referred to simply as eddy current hereinbelow.

Next, at Step 507, whether Ac>Amax or not is decided. Amax is a predetermined upper limit value. The upper limit value Amax is, for example, the maximum amplitude of a corrective value that can be output by a gradient power supply i.e., the gradient driving section 130. This step enables performance of the gradient driving section 130 to be used at its maximum. The value of Amax may be appropriately set within a range that can be output by the gradient driving section 130.

If Ac>Amax does not hold, Ac_final=Ac is set at Step 521. Ac_final is a determined corrective value. Next, at Step 525, Ac_final is adopted as a corrective value for eddy current of short time constant. At this step, the calculated corrective value Ac is determined as the corrective value for eddy current correction. Since Ac>Amax does not hold, the gradient driving section 130 can output the corrective value Ac.

If Ac>Amax, Ac=Ac−delta_amp is set at Step 509. Specifically, Ac is reduced by delta_amp. Delta_amp is a predetermined constant value. At this step, a candidate corrective value smaller than the calculated value is obtained.

Next, at Step 511, whether Ac>Amax or not is decided. If Ac>Amax, the flow goes back to Step 509 and Ac is reduced. These steps are repeated while Ac>Amax.

If Ac>Amax does not hold, a gradient magnetic field affected by eddy current is simulated using Ac at Step 513. Specifically, a gradient magnetic field pre-emphasized by Ac, eddy current generated by this gradient magnetic field, and a gradient magnetic field affected by the eddy current are simulated. The gradient magnetic field affected by eddy current will be sometimes referred to as an effective gradient magnetic field hereinbelow. The waveform of the gradient magnetic field is square or trapezoidal.

Next, at Step 515, the time length Tf of the flat top of the waveform of the gradient magnetic field is stored. The time length Tf of the flat top of the waveform of the effective gradient magnetic field is stored. The term "flat top" denotes a flat portion of the top of a square or trapezoidal wave. For a constant amplitude and pulse width in a square or trapezoidal wave, the efficiency of the gradient magnetic field operating on spins is higher for a flat top of longer time length.

Next, at Step 517, whether Ac<A_limit or not is decided. A_limit is a predetermined lower limit value. The lower limit value A_limit is determined as an appropriate value based on experience, for example.

If Ac<A_limit does not hold, the flow goes back to Step 509 to set Ac=Ac−delta_amp, and the processing of Steps 511–515 is executed for the new Ac. Such processing is repeated while Ac<A_limit does not hold. Thus, an effective gradient magnetic field is simulated and the time length Tf of its flat top is stored for each sequentially decreasing value of Ac.

Since candidate corrective values are thus generated by stepwise decreasing of the calculated value, a proper candidate value can be obtained. Moreover, since the step difference of the decreasing is constant, the candidate corrective values are easily generated. The plurality of candidate corrective values may be appropriate ones different from one another between Amax and A_limit.

If Ac<A_limit, whether Ac with the longest Tf is present or not is decided at Step 519. If such Ac is found, Ac_final=Ac is set at Step 521 and Ac_final is adopted as the corrective value for eddy current of short time constant at Step 525. Since decreasing of Ac is thus stopped when Ac<A_limit, excessive decreasing can be prevented.

As described above, Ac with the longest Tf is used as Ac_final. The gradient magnetic field with the longest Tf is relatively most efficient, whereby a corrective value for obtaining a relatively optimal gradient magnetic field is determined.

If Ac with the longest Tf is not found, Ac_final=Ac_limit is set at Step 523. Thus, if no corrective value for obtaining a relatively optimal gradient magnetic field is found, the lower limit value Ac_limit for the corrective value is defined as the determined corrective value. Thus, eddy current correction with the smallest corrective value can be achieved.

Figure 6:
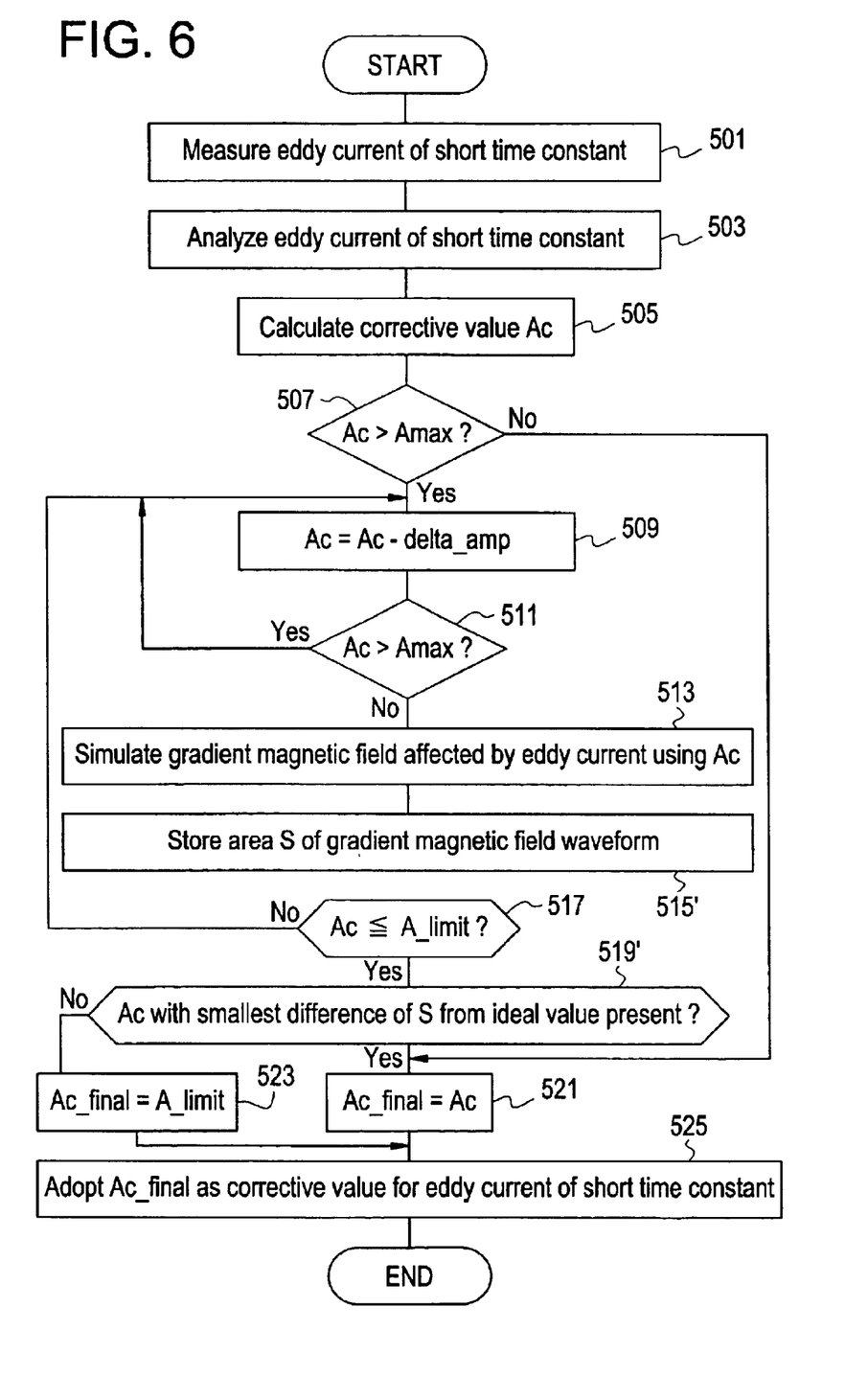
FIG. 6 is a flow chart of the operation by the apparatus in accordance with one embodiment of the present invention.

FIG. 6 shows a flow chart of another operation of the present apparatus in determining a corrective value for eddy current correction. In FIG. 6, similar processing operations to those shown in FIG. 5 are designated by similar reference numerals and the explanation thereof will be omitted. The differences from the processing shown in FIG. 5 are in Steps 515' and 519'. At Step 515', an area S of the simulated gradient magnetic field waveform is stored. At Step 519', whether Ac minimizing the difference of S from an ideal value is present or not is decided.

The ideal value for S is an area of an ideal gradient magnetic field completely unaffected by eddy current. Since efficacy of a gradient magnetic field is determined by the area of its waveform, a gradient magnetic field whose difference of S from an ideal value is minimized is one closest to the ideal gradient magnetic field, and hence, the relatively optimal gradient magnetic field.

If such Ac is found, that Ac is adopted as the corrective value for eddy current of short time constant by the processing at Steps 521 and 525. Since the waveform area S is used, it is possible to determine a corrective value for a gradient magnetic field having any waveform, not only the square or trapezoidal wave.

The determination of the corrective value as described above is conducted for the gradient along each axis. The determination of the corrective value for each axis may be conducted on individual gradient pulses. The corrective value may be determined by adopting an empirical value when Ac>Amax, instead of being determined by the simulation as described above.

In conducting a scan by the present apparatus, eddy current correction is conducted by the gradient magnetic field correction (pre-emphasis) based on the corrective value determined as above. Thus, optimal eddy current correction can be achieved within the output range of the gradient driving section 130, and imaging with good quality can be achieved.

Figure 7:
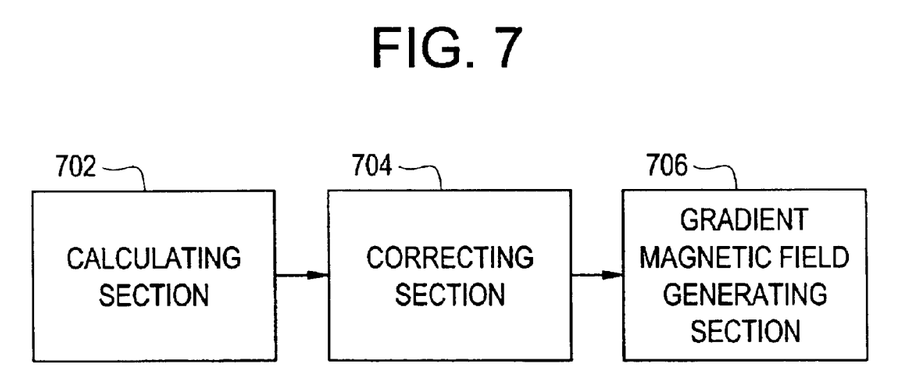
FIG. 7 is a functional block diagram of the apparatus in accordance with one embodiment of the present invention.

FIG. 7 shows a functional block diagram of the present apparatus with emphasis on the eddy current correction. As shown, the present apparatus comprises a calculating section 702, a correcting section 704, and a gradient magnetic field generating section 706. The calculating section 702 serves the function of Steps 501–505 shown in FIG. 5 or 6. The correcting section 704 serves the function of Steps 507–525 shown in FIG. 5 or 6. The gradient magnetic field generating section 706 serves the function of the magnet system 100 or 100' and gradient driving section 130 shown in FIG. 1 or 2.

The calculating section 702 is an embodiment of the calculating means in the present invention. The correcting section 704 is an embodiment of the correcting means in the present invention. The gradient magnetic field generating section 706 is an embodiment of the gradient magnetic field generating means in the present invention.

The calculating section 702 calculates a corrective value for eddy current correction as described above, and inputs the value to the correcting section 704. The correcting section 704 determines a corrective value as described above, and corrects the gradient magnetic fields in the gradient magnetic field generating section 706 based on the corrective value.

While the present invention has been described with reference to preferred embodiments hereinabove, various changes or substitutions may be made on these embodiments by those ordinarily skilled in the art pertinent to the present invention without departing from the technical scope of the present invention. Therefore, the technical scope of the present invention encompasses not only those embodiments described above but all that fall within the scope of the appended claims.

Many widely different embodiments of the invention may be configured without departing from the spirit and the scope of the present invention. It should be understood that the present invention is not limited to the specific embodiments described in the specification, except as defined in the appended claims.

What is claimed is:

1. An eddy current correction method comprising:
   calculating a corrective value for eddy current correction for a gradient magnetic field;
   if the calculated value does not exceed a predetermined upper limit value, conducting correction on the gradient magnetic field using the calculated value; and
   if the calculated value exceeds the predetermined upper limit value, simulating a plurality of gradient magnetic fields affected by eddy current using a plurality of candidate corrective values not greater than the upper limit value, and conducting correction on the gradient magnetic field using a candidate corrective value by which a relatively optimal gradient magnetic field can be obtained.

2. The eddy current correction method of claim 1, wherein said upper limit value is the maximum corrective value that can be output by a gradient power supply.

3. The eddy current correction method of claim 1, wherein said optimal gradient magnetic field is a gradient magnetic field whose length in a flat top portion of a trapezoidal wave is largest.

4. The eddy current correction method of claim 1, wherein said optimal gradient magnetic field is a gradient magnetic field whose waveform area is least different from a waveform area of an ideal gradient magnetic field.

5. The eddy current correction method of claim 1, wherein said plurality of candidate corrective values are determined by sequentially decreasing said calculated value.

6. The eddy current correction method of claim 5, wherein a step difference in said decreasing is constant.

7. The eddy current correction method of claim 5, wherein said candidate corrective values are not lower than a predetermined lower limit value.

8. The eddy current correction method of claim 7, wherein if the optimal gradient magnetic field cannot be obtained, the correction is conducted using said lower limit value.

9. A magnetic resonance imaging apparatus for applying to a subject to be imaged a static magnetic field, a gradient magnetic field and an RF magnetic field generated by static magnetic field generating means, gradient magnetic field generating means and RF magnetic field generating means, respectively, acquiring magnetic resonance signals, and producing an image by image producing means based on the acquired magnetic resonance signals, comprising:
   a calculating device for calculating a corrective value for eddy current correction for said gradient magnetic field; and
   a correcting device for, if the calculated value does not exceed a predetermined upper limit value, conducting correction on said gradient magnetic field using the calculated value, and if the calculated value exceeds the predetermined upper limit value, simulating a plurality of gradient magnetic fields affected by eddy current using a plurality of candidate corrective values not greater than the upper limit value, and conducting correction on said gradient magnetic field using a candidate corrective value by which a relatively optimal gradient magnetic field can be obtained.

10. The magnetic resonance imaging apparatus of claim 9, wherein said upper limit value is the maximum corrective value that can be output by said gradient magnetic field generating device.

11. The magnetic resonance imaging apparatus of claim 9, wherein said optimal gradient magnetic field is a gradient magnetic field whose length in a flat top portion of a trapezoidal wave is largest.

12. The magnetic resonance imaging apparatus of claim 9, wherein said optimal gradient magnetic field is a gradient magnetic field whose waveform area is least different from a waveform area of an ideal gradient magnetic field.

13. The magnetic resonance imaging apparatus of claim 9, wherein said plurality of candidate corrective values are determined by sequentially decreasing said calculated value.

14. The magnetic resonance imaging apparatus of claim 13, wherein a step difference in said decreasing is constant.

15. The magnetic resonance imaging apparatus of claim 13, wherein said candidate corrective values are not lower than a predetermined lower limit value.

16. The magnetic resonance imaging apparatus of claim 15, wherein if the optimal gradient magnetic field cannot be obtained, said correcting device conducts the correction using said lower limit value.

* * * * *